United States Patent [19]

Riley

[11] Patent Number: 4,860,439
[45] Date of Patent: Aug. 29, 1989

[54] UNIVERSAL ALIGNMENT FIXTURE

[76] Inventor: Bryan R. Riley, 15212 Dickens Ave., San Jose, Calif. 95066

[21] Appl. No.: 262,470

[22] Filed: Oct. 25, 1988

[51] Int. Cl.⁴ ............................................. B23P 19/00
[52] U.S. Cl. ....................................... 29/741; 29/759; 198/345; 198/346.2; 269/903
[58] Field of Search ......................... 29/741, 759, 834; 279/1 L; 414/226; 198/345, 346.2; 269/903, 153, 155, 254 R, 234

[56] References Cited

U.S. PATENT DOCUMENTS

| | | | |
|---|---|---|---|
| 3,590,457 | 7/1971 | Gustetic | 29/759 |
| 4,320,574 | 3/1982 | Harigane et al. | 29/741 |
| 4,521,959 | 6/1985 | Sprenkle | 29/741 |

OTHER PUBLICATIONS

Sorenson, W. W., Western Electric Technical Digest, No. 46, p. 31, Apr. 1977.

*Primary Examiner*—P. W. Echols
*Attorney, Agent, or Firm*—Joseph H. Smith

[57] ABSTRACT

An apparatus is configured to pick up and hold a pin grip array (PGA) and to automatically align it in that process by using the electrical lead pins themselves of the pin grid array as the indexing element for the pick up process. Included are a plurality of grippers, each of the grippers having an alignment surface for engaging from outside the rectangular perimeter of lead pins on the PGA, at least one side of the rectangular perimeter of the pins, each of the grippers having a gripper indexing surface. The apparatus also includes a base for holding the PGA and the plurality of grippers. The base has a base indexing surface for each gripper indexing surface, the base having a spring element for pulling on each of the grippers so as to bring each of the gripper indexing surfaces into juxtaposition with its respective base indexing surface. Each base indexing surface is located such that when the gripper indexing surface is pulled against the base indexing surface, the alignment surface of each gripper is located at a position that would engage that side of the rectangular perimeter of the pins.

4 Claims, 3 Drawing Sheets

UNIVERSAL ALIGNMENT FIXTURE

BACKGROUND OF THE INVENTION

This invention concerns an alignment and holding mechanism for a pin grid array (PGA), particularly such a mechanism that is adapted to use the pins of the PGA to cause self-alignment within the mechanism.

In the art of testing PGA's and in the art of autoinsertion of PGA's, a common problem is to insure that the PGA is properly aligned so that it can be inserted into its socket, whether that socket is for testing or for the eventual placement of the PGA in a circuit. As a result, it is typical in the art to perform an alignment process before attempting the insertion. This alignment process is typically separate from the pick up and holding of the PGA which involves the use of a vacuum cup. In one prior art process, the vacuum cup is used to place the PGA in a V-block, i.e. a piece of metal in the shape of a right angle that is accurately machined to align the pins of the PGA on two sides in a particular location and orientataion. Then vacuum is released, and the PGA is allowed to settle to the proper location and orientation. Then the vacuum is applied again, now with the PGA in a known orinetation and position. The PGA can then be moved around robotically via the vacuum cup once this initiallization is complete. In another method, a V-block is not used, but air cylinders immediatly prior to test set insertion are used to properly align the PGA before insertion. The air cylinders also have a typical V-shaped alignment. Once the PGA is aligned, the air cyliders are moved back out of the way to allow insertion into the test block. Both of these process are two-step operations, in the sense that they are independent of the pick up and holding of the PGA. Hence, they take time that would not otherwise be required if the PGA were properly aligned in the pick up process itself.

SUMMARY OF THE INVENTION

In accordance with preferred embodiments of the invention, an apparatus is provided which is configured to pick up and hold a PGA and to automatically align it in that process by using the electrical lead pins themselves of the pin grid array as the indexing element for the pick up process. In the typical system, a standard PGA is used which has an array of electrical lead pins imbedded in a base, with the pins forming a rectangular perimeter around the base of the PGA. The apparatus of the invention includes a plurality of grippers, each of the grippers having an alignment surface for engaging from outside the rectangular perimeter at least one side of the rectangular perimeter of the pins, each of the grippers having a gripper indexing surface. The apparatus also includes a base for holding the PGA and the plurality of grippers. The base has a base indexing surface for each gripper indexing surface, the base having a spring element for pulling on each of the grippers so as to bring each of the gripper indexing surfaces into juxtaposition with its respective base indexing surface. Each base indexing surface is located such that when the gripper indexing surface is pulled against the base indexing surface, the alignment surface of each gripper is located at a position that would engage that side of the rectangular perimeter of the pins.

In the preferred mode, each of the grippers further includes an actuating element, and a pin for attaching the gripper to the base such that the gripper rotates about the axis of its corresponding pin. Also in the preferred mdoe, the apparatus further includes an actuating systemt for engaging the actuating elements of the grippers for causing the grippers to rotate about their respective pins against the force of thw spring so as to open the grippers in order to receive the PGA. In the preferred embodiment, the actuating system includes a plurality of fixed actuator stanchions and a piston coupled to the base for raising and lowering the base relative to the actuator stanchions. Also, the actuator stanchions are positioned to engage the actuating elements of the grippers as the base is raised and lowered.

DESCRIPTION OF THE PREFERRED EMBODIMENTS

Figure 1:
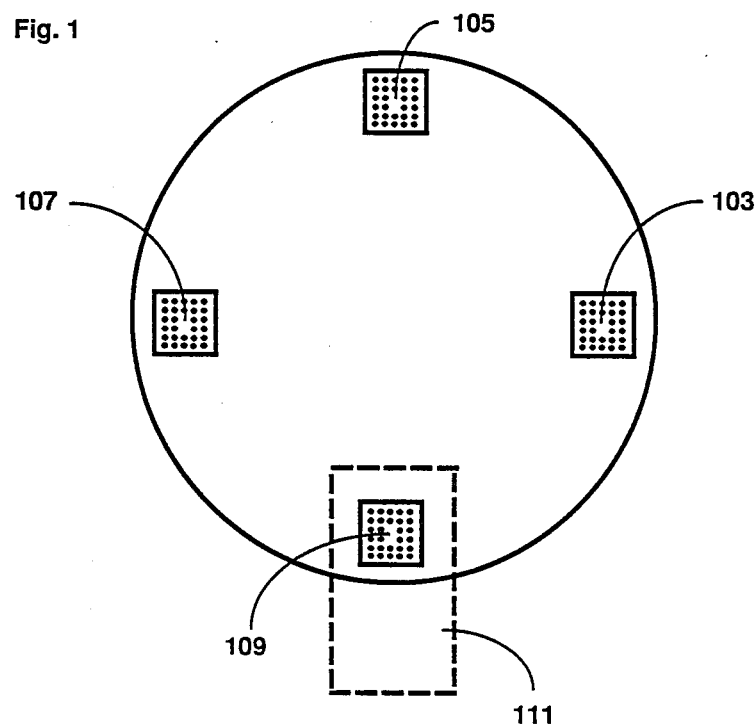
FIG. 1 shows a top view of a dial indexing apparatus according to the invention for serving PGA's to a test head.

Shown in FIG. 1 is a dial index apparatus 101 holding a plurality of PGA's 103, 105, 107, and 109, with PGA 109 located immediately below a test head 111 (shown as a dotted box) configured for receiving a PGA. Each of the PGA's has the same number of electrical lead pins, which are typically in number 84, 100, 120 or 149 pins, since those are the standards in the industry. In each case the PGA's have a rectangular base and the pins project at right angles to the base and are arranged in a grid over a substantial portion of the surface of the PGA. Typically ,the outermost rows of pins are relatively close to the edge of the base and define a rectangular perimeter of electrical lead pins, such as illustrated in cross-section by pins 204 and 206 in FIG. 2A. In the industry, the dimensions of this perimeter of pins are closely controlled and standardized, in order to fit standardized sockets used in the test heads, whereas the size and configuration of the bases are not, and typically the dimensions of the bases will vary from manufacturer to manufacturer.

Figure 2C:
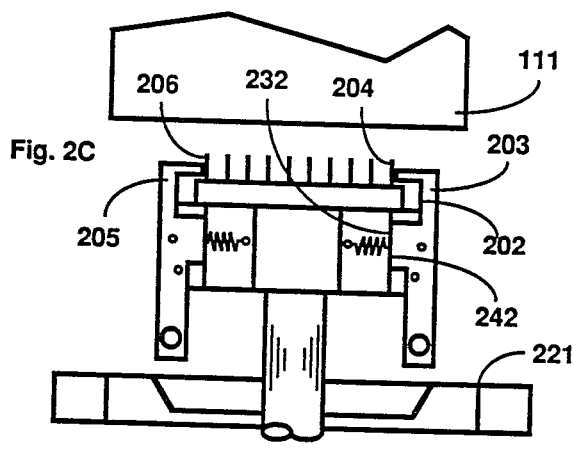
FIG. 2C shows the same view of the operation of FIG. 2A in which the pick up is complete and the PGA is ready to be inserted into a test set.
Figure 2B:
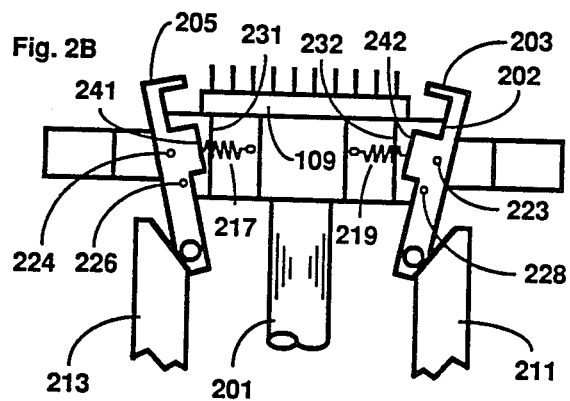
FIG. 2B shows the same view of the operation of FIG. 2A, but further along in the pick up process.
Figure 2A:
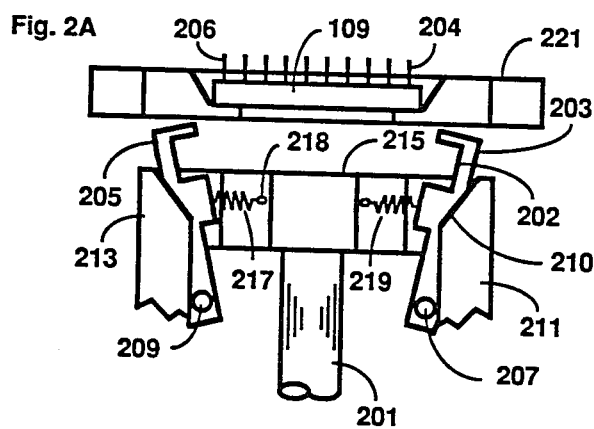
FIG. 2A shows a partially cut away side view of an apparatus according to the invention in position ready to pick up a PGA from a stationary holder.
Figure 3:
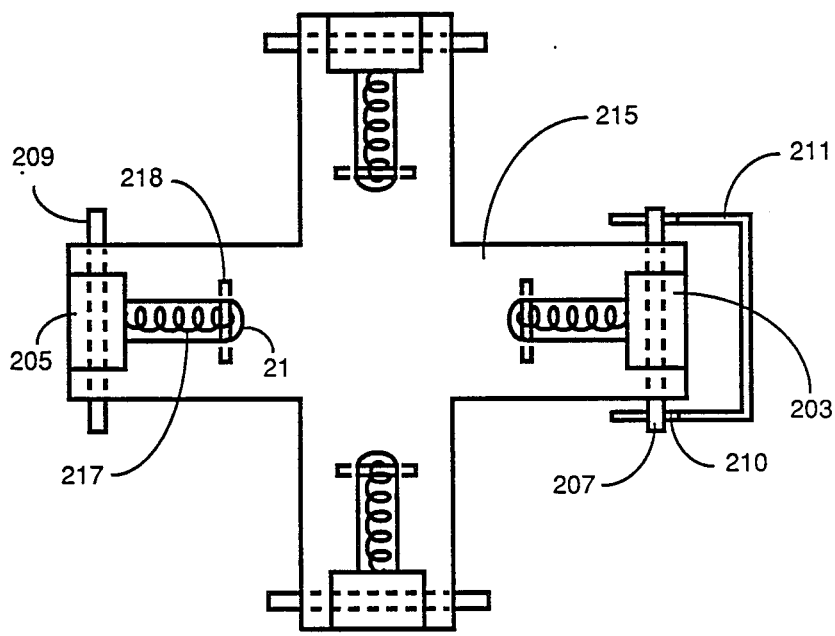
FIG. 3 shows a top view of the apparatus according to the invention.

During operation, each PGA to be tested is rotated into position below the test head, and the PGA is raised until it is inserted into the socket (not shown) in the test head. Stage one of the insertion process is illustrated in FIG. 2A. The PGA 109 is shown suspended by its corners by pocket fixture 221 which is part of the dial index apparatus 101. Below the PGA 109 is the pick up and holding system of the invention. It is made up of a base 215 and a plurality of grippers, which in this embodiment amounts to four, one gripper for each side of the PGA. In this case only two grippers, grippers 203 and 205, are shown due to the cross-sectional view. The grippers are attached to base 215 by pins 226 and 228 (shown in FIG. 2B) and by springs 217 and 219. The springs are attached to the base by pins such as pin 218, and to the grippers by pins such as pins 223 and 224. Such pin attachments are conventional and other methods of attachment would be equally acceptable. The grippers include actuator elements 207 and 209, which in this preferred mode are also pins extending through the gripper and extending the edges of the base. The base of the apparatus is attached to a piston 201, typically driven up and down by a pressure cell (not shown). In the down position, as illustrated in FIG. 2A, the tops of grippers 203 and 205 are forced to rotate outwards relative to pins 226 and 228 into an open position, by means of vertical actuator stanchions 213 and 211, which act to push actuator elements 207 and 209 toward the center of the base. In the preferred mode, there are four such stanchions, one for each gripper, and the stanchions are fixed in height relative to the fixture 221 which holds the PGA 109. The stanchions are also fixed horizontally, and include a slanted portion, such as portion 210, which acts to push the gripper actuator element 207 toward the center of the base as the piston moves down and lets the spring 219 move the actuator element 207 away from the center of the base as the piston moves up (see FIG. 2B). A top view of the base and grippers is shown in FIG. 3 as well as a top view of stanchion 211. The other three stanchions are identical, but are not shown so as not be confuse the drawing.

As the piston 201 moves upward with the grippers in the open position, the base eventually rests against the bottom of the PGA 109 and lifts it off of pocket fixture 221. As the piston continues upward as shown in FIG. 2B, the actuator elements 207 and 209 eventually engage the slanted portions of stanchions 211 and 213, and the grippers 203 and 205 move inward at the top, and eventually engage the perimeter pins 204 and 206 as illustrated in FIG. 2C. Each of the grippers, near the top, has a cut out portion such as portion 202, to avoid contact with the base of PGA 109 when the gripper is closed onto the pins. The cut out is, in the preferred mode, sufficiently large so that the grippers can be indexed against the pins of many different sized bases encountered from different manufacturers, without touching the bases themselves. In order to ensure that the PGA is always positioned at the same location in the assembly, the base 215 has an indexing surface for each gripper, such as indexing surfaces 231 and 232, and the grippers have corresponding indexing surfaces such as surfaces 241 and 242. In the closed position as illustrated in FIG. 2C, these index surfaces are touching each other and thereby set a particular location for the upper portion of the grippers in order to locate the grippers accurately against the lead pins of the PGA's. The grippers are also cut out on their lower portions so that those portions may rotate toward the center of the base about pins 226 and 228 without being immediately stopped by index 231 and 232.

Figure 4:
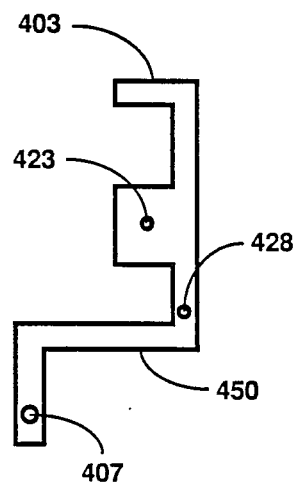
FIG. 4 shows an alternative embodiment of a gripper according to the invention.

A convenient feature of the above design is that the actuator stanchions and the piston can be used unchanged with different sized gripper assemblies to accomodate different sized PGA's. For example, to accomodate larger assemblies, one would merely replace the previously described base and gripper combination with a larger base and a gripper with a slightly different design, for example with the gripper 403 shown in FIG. 4. Gripper 403 is substantially the same as gripper 203 and has an attachment element (pin) 423 for attaching the spring system to hold the gripper against the indexing surface of the base, a pin 428 about which the gripper rotates, and an actuating element 407 as before. The difference between gripper 403 and gripper 203 is horizontal portion 450 which makes it possible to have the upper portions of the grippers substantially further apart than the separation of the actuator stanchions, as long as the actuating elements such as 407 are in proper alignment with the stanchions to coact therewith as before. Hence, when switching from one size PGA to another for testing, one merely replaces the base and grippers as a unit.

Other benefits of the invention include the fact that the system hold the PGA's in a postive manner, due to the fact that the edge of the grippers laps the edge of the PGA. Hence, if the PGA should become stuck in the socket, the grippers will pull the PGA out of the socket as the piston is moved to the down position. This is quite unlike the vacuum type systems which will merely break vacuum, leaving the PGA in the socket and requiring shut down of the testing procedure while the PGA is removed.

Those skilled in the art will understand that there are many equivalent variations of the above invention. For example, one could use only two grippers instead of four, each having the shape of the letter "V" for indexing against the corner lead pins of the PGA's. Similarly, there is nothing to restrict the concept of the invention to testing systems, since any time a PGA must be placed into a socket automatically, the system of the invention would be useful for that insertion. Also, the actuator stanchions need not be in the shape of a channel in cross-section as shown, but each could be merely two uprights configured to engage the actuator elements of the grippers. Hence, due to these many equivalent variations, it is believed that the invention should be interpreted in light of the appended claims, and not be restricted to the particular embodiments used to describe it.

I claim:

1. An apparatus for picking up, aligning, and holding a pin grid array, hereinafter PGA, said PGA having an array of electrical lead pins imbedded in a base, with said pins forming a rectangular perimeter around the base of said PGA, comprising:

a plurality of grippers, each of said grippers having an alignment surface for engaging from outside said rectangular perimeter at least one side of said rectangular perimeter of said pins, each of said grippers having a gripper indexing surface;

base means holding the PGA, said base means for holding said plurality of grippers, said base means having a base indexing surface for each gripper indexing surface, said base means having spring means for pulling on each of said grippers so as to bring each of said gripper indexing surfaces into juxtaposition with its respective base indexing surface, said base indexing surface located such that when said gripper indexing surface is pulled against said base indexing surface, the alignment surface of each gripper is located at a position that would engage said at least one side of said rectangular perimeter of said pins.

2. An apparatus as in claim 1 wherein each of said grippers further comprises pin means for attaching said gripper to said base means such that said gripper rotates about the axis of its corresponding pin means.

3. An apparatus as in claim 2 wherein each of said grippers further comprises an actuating element;

said apparatus further comprising actuation means for engaging said actuating elements of said grippers for causing said grippers to rotate about their respective pin means against the force of said spring means so as to open said grippers in order to receive said PGA.

4. An apparatus as in claim 3 wherein said actuating means comprises a plurality of fixed actuator stanchions; and piston means coupled to said base means for raising and lowering said base means relative to said actuator stanchions;

said actuator stanchions positioned to engage said actuating elements of said grippers as said base means is raised and lowered.

* * * * *